United States Patent [19]

Maelzer et al.

[11] Patent Number: 4,899,104

[45] Date of Patent: Feb. 6, 1990

[54] ADAPTER FOR A PRINTED CIRCUIT BOARD TESTING DEVICE

[75] Inventors: Martin Maelzer, Hagenburger Str. 26, D-3050 Wunstorf, Fed. Rep. of Germany; Rüdiger Dehmel, Wunstorf, Fed. Rep. of Germany; Hans-Hermann Higgen, Stadthagen, Fed. Rep. of Germany; Andreas Gülzow, Springe, Fed. Rep. of Germany

[73] Assignees: Erich Luther; Martin Maelzer, both of Wunstorf, Fed. Rep. of Germany

[21] Appl. No.: 121,039

[22] Filed: Nov. 16, 1987

[30] Foreign Application Priority Data

Nov. 18, 1986 [DE] Fed. Rep. of Germany ....... 3639359
Oct. 29, 1987 [DE] Fed. Rep. of Germany ....... 3736689

[51] Int. Cl.[4] .......................... G01R 1/02; G01R 1/04
[52] U.S. Cl. ............................... 324/158 F; 324/158 P
[58] Field of Search ............... 324/93 PC; 439/158 P, 439/72.5, 158 F

[56] References Cited

U.S. PATENT DOCUMENTS

| 68,493 | 1/1883 | Coughlin | 324/158 P |
|---|---|---|---|
| 4,164,704 | 8/1979 | Kato et al. | |
| 4,417,204 | 11/1983 | Dehmel et al. | 324/73 PC |
| 4,423,376 | 12/1983 | Byrnes et al. | |
| 4,506,215 | 3/1985 | Coughlin | 324/72.5 |
| 4,535,536 | 8/1985 | Wyss | |
| 4,622,514 | 11/1986 | Lewis | |
| 4,633,176 | 12/1986 | Reimer | 324/158 F |
| 4,686,467 | 8/1987 | DeLapp et al. | |
| 4,724,377 | 2/1988 | Maelzer et al. | 324/73 PC |

FOREIGN PATENT DOCUMENTS

| 0050913 | 5/1982 | European Pat. Off. | |
|---|---|---|---|
| 164672 | 12/1985 | European Pat. Off. | |
| 0164722 | 12/1985 | European Pat. Off. | 324/73 PC |
| 2933862 | 3/1981 | Fed. Rep. of Germany | |
| 3340184 | 5/1985 | Fed. Rep. of Germany | |
| 3444708 | 6/1985 | Fed. Rep. of Germany | |
| 3533218 | 3/1986 | Fed. Rep. of Germany | |
| 3507619 | 9/1986 | Fed. Rep. of Germany | |
| 0291735 | 1/1936 | Italy | 439/482 |
| 0072060 | 4/1983 | Japan | 324/158 P |
| 49270 | 3/1985 | Japan | |
| 60-49270 | 3/1985 | Japan | |
| 0038575 | 2/1986 | Japan | 324/158 F |
| 0176866 | 8/1986 | Japan | 324/73 PC |
| 2146849 | 4/1985 | United Kingdom | |

OTHER PUBLICATIONS

"Probe-to-Coupling Block Pressure Contact With Dust Seal", by Faure et al., IBM Tech. Disc. Bull., vol. 18, No. 3, 8/75.
Mania Brochure "Universalgrund Adapter System," Mania GmbH, Haupstrasse 86, D-6384 Schmitten 2, W. Germany, 3/21/84, pp. 1-7.
Ingun Prumittel bau Konstanz, "Adapter und Zubehor VA-Katalog", Feb. 1985 (in German).
"Taper-Lock Probing Device", by Dopp et al., IBM Tech. Disc. Bull., vol. 13, No. 9, 2/71, p. 2613.
"Spring-Test Probe", by Barnum, IBM Tech. Disc. Bull. 12/73, pp. 2167-2168, vol. 16, No. 7.
"Twin Contact Multiple Connector", by Bohannon, Western Electric 4/71, No. 22, pp. 9-10.

Primary Examiner—Reinhard J. Eisenzopf
Assistant Examiner—W. Burns
Attorney, Agent, or Firm—Fitzpatrick, Cella, Harper & Scinto

[57] ABSTRACT

An adapter for a printed circuit board testing device, by means of which the test contacts located on the grid can be connected to test points of a printed circuit board to be tested that are located on and/or off grid means of test pins that are received in guide holes in the adapter and each have a pointed contacting section that is directed towards the respective contact point of the printed circuit board and projects from the adapter and an adjacent guidance section that is guided in the associated guide hole of the adapter, is to be designed so that even test pieces in which the test points are relatively close together and/or with large displacements from the grid can be tested. This is done by reducing the cross-section of the guidance section conically or in steps towards the contacting section, and that the cross-section of the guide bores is correspondingly reduced.

26 Claims, 4 Drawing Sheets

ADAPTER FOR A PRINTED CIRCUIT BOARD TESTING DEVICE

TECHNICAL FIELD OF THE INVENTION

The invention relates to an adapter for a printed circuit board testing device, by means of which test contacts located on a grid can be connected to test points of a printed circuit board to be tested that are located on and/or off grid by means of test pins.

BACKGROUND OF THE INVENTION AND PRIOR ART

The purpose of such an adapter is to provide an electrical contact between test contacts on the grid and test points that are on and/or off the grid. This is done by positioning the test pins in the adapter in particular inclined positions. Fitting the adapter with the test pins can be done either manually or mechanically, and either semi-automatically or fully automatically.

An adapter of the kind described above is the subject of an earlier proposal by the applicant. In this arrangement the test pins have cylindrical shafts, of which the ends remote from the heads are tapered conically to a point to form contact sections, the angle of the point being about 90°.

This known arrangement has proven to be very advantageous, but it still needs to be improved, for the following reasons. Because of the predetermined thickness of the test pin it is only possible to test test-pieces whose test points are relatively far apart. This limits the field of use of this adapter, particularly for so-called SMD (surface mounted device) test pieces.

OBJECT OF THE INVENTION

The object of the invention is to provide an adapter of the above-mentioned kind so that it can also be used to test test-pieces with test points a relatively small distance apart and/or with test points lying far off the grid.

SUMMARY OF THE INVENTION

This object is achieved by the configuring at least one pin such that its cross section is reduced, either conically or in steps toward points which form contact sections and forming adapter guide bores for the pins which are correspondingly reduced in diameter.

In the arrangement according to the invention the test pins can be set at such a great inclination that their tips are always close to the neighbouring test pin. In other words the tips of the test pins are shaped so that at the maximum possible inclination of the test pins—viewed in a projection at right angles to the guide plates—their tips form points that lie substantially on the perimeter of their projection image. With the arrangement according to the invention the distance between the test points can be quite substantially reduced. In this connection it should be noted that the distance between the test points also depends on the wall thickness required for reasons of strength between two neighbouring guide holes in the adapter. Consequently arrangements are also possible within the scope of the invention, in which the tip of the test pin is at a distance inside the frame of the projection image that is somewhat less than half the wall thickness between the neighbouring guide holes.

A uniformly tapered test pin is advantageous in allowing the extent of the displacements of the guide holes in the guide plates to be determined using simpler criteria. A test pin that is tapered stepwise is advantageous on manufacturing grounds, since such a test pin can be made by hammer forging.

The arrangement according to some more specific aspects of the invention lead to a test pin that because of different maximum inclinations can be used in most instances and is thus universal.

The conically tapering between each successive step makes for trouble-free introduction of the test pins into the guide holes.

The arrangement according to another aspect of the invention, wherein three parallel guide plates are provided with a third plate being located between first and second plates and the guide holes in the first plate being on a grid and the guide holes in the second plate being on and/or off the grid, leads to a simplification of the adapter.

According to another aspect of the invention, wherein the third and other guide plates located between the first and second plates likewise have guide holes that are on and/or off grid and wherein the off grid holes are placed so that on initial insertion vertically into the guide holes of the first guide plate, the tapering ends of the test pins are steered into the off-grid guide holes of the second guide plate, provides improved introduction of the test pins.

A further aspect namely the tapering of the cross section of the pins, at least near the tip, contributes to the stabilization of the test pins in the region of their tips. This feature can involve both a progressive tapering and a conical tip with a conical angle greater than the other part of the taper. It is also advantageous to round off or slightly blunt the tip of the test pins; this also represents a progressive tapering.

Because of the reduction in cross-section according to the invention the test pins are flexible, particularly in the region of their tips. Whilst a certain degree of flexibility is an advantage, it is desirable at least to avoid substantial bending of the test pin.

The arrangements according to other aspects of the invention relate to a simple means of spacing and positioning the guide plates in the associated adapter frames that is economical to produce.

Another aspect of the invention, namely one in which the guide holes extend in the guide plates in the desired inclined position of the associated test pins, is advantageous in that it gives greater contact surfaces between the walls of the guide hole and the test pin. In addition the guide holes can be bored all together.

BRIEF DESCRIPTION OF THE DRAWINGS

The invention will now be described in more detail by way of example with reference to embodiments shown in simplified drawings, in which.

DETAILED DESCRIPTION OF PREFERRED EMBODIMENTS OF THE INVENTION

Figure 1:
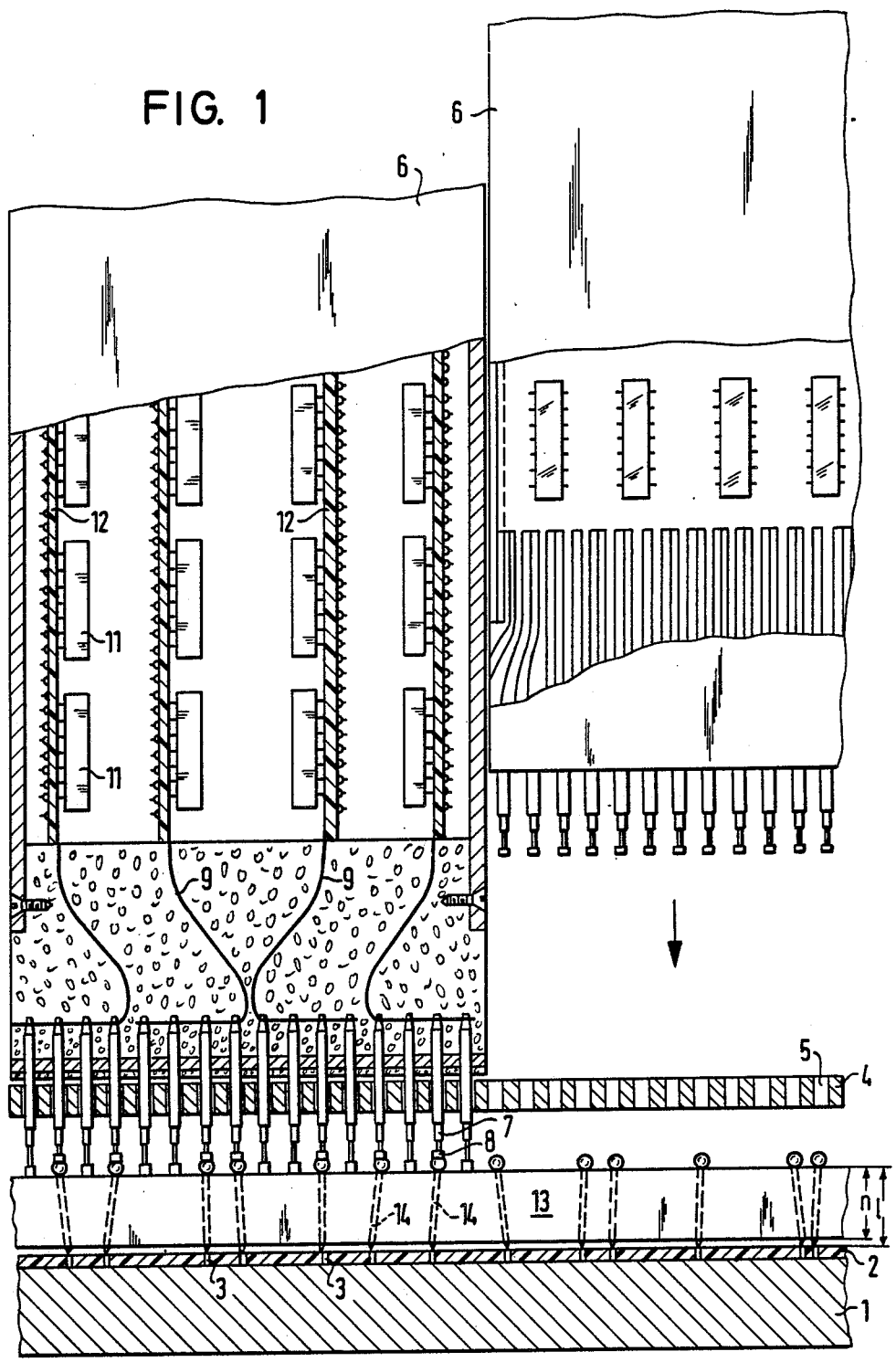
FIG. 1 shows a partial section through a printed circuit board testing device, the section being at right angles to the adapter fitted with test pins that is fitted to the device.

In FIG. 1 a reception plate of the device for testing circuit boards, which is not shown as a whole, is indicated by 1. On this reception plate 1 there is a printed circuit board 2 with test points 3. Above the printed circuit board 2 to be tested there is a perforated grid plate 4 in which the holes 5 are arranged on the grid and two modules 6 that are movable towards and away from the printed circuit board 2 and are provided on their lower faces with test contacts 7 in the form of pins which pass through the holes 5 in the perforated grid plate 4 when a module 6 is in its lowered position. The test contacts 7 carry telescopically extendible and retractable test contact heads 8 that are pre-stressed towards their outer end position by a spring (not shown).

The test contacts 7 are fixed in the module 6 by casting and are connected by electrical leads 9 to circuit boards 12 carrying IC chips 11 that are arranged within the modules 6 and constitute, together with the circuit boards 12, the IC chips 11 and possibly also further components, a partial switching matrix associated with the test contacts 7.

On the printed circuit board 2 there is a grid-matching adapter 13 having a plurality of test pins 14 that pass through it and connect the test contacts 7 arranged on the grid with the test points 3 arranged on and/or off the grid. The test pins are therefore not aligned with the respective test contacts but extend obliquely through the adapter 13, with their heads at the top and overlengths at the bottom projecting from the adapter 13 and forming contact points raised from the upper and lower sides thereof.

Figure 2:
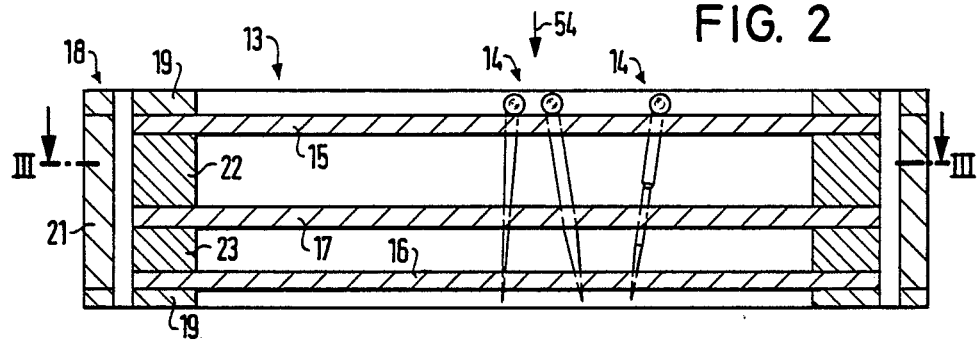
FIG. 2 shows the adapter in vertical section.

The adapter 13 comprises several superimposed guide plates spaced apart from one another. In the embodiment according to FIG. 2 there are three guide plates, the top one being numbered 15, the bottom one 16 and the middle one 17. Three test pins 14 are indicated, which will be described in detail later. The adapter has a frame, indicated generally by 18, which can consist of frame parts 19, 21 in which the guide plates 15 to 17 are positioned by means of spacer rails 22, 23 arranged between them. The spacer rails 22, 23 each likewise form a frame (cf. FIG. 3), whereby the guide plates 15, 17, are supported around their whole periphery and are thus largely stabilised.

Figure 3:
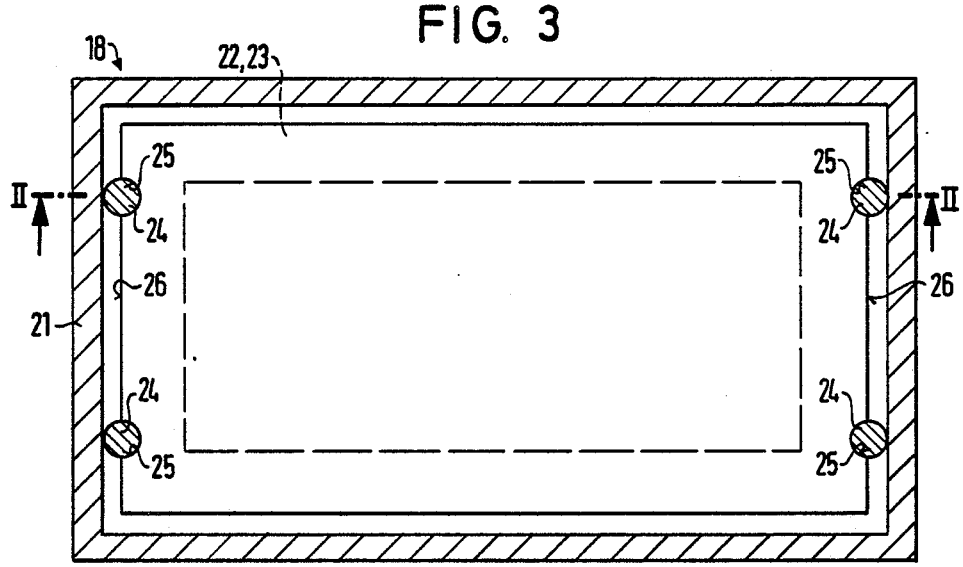
FIG. 3 shows the section on III—III in FIG. 2.

As is clearly shown in FIG. 3, the horizontal positioning of the guide plates 15 to 17 in the frame 18 is effected by vertical retaining bolts 24, preferably of circular section, which can be fixed in various ways in the frame 18, particularly in the upper and lower parts 19 of the frame. They can for example be placed in holes with grub screws serving for axial fixing. In the present embodiment four retaining bolts 24 are provided, arranged on opposite sides and spaced apart from one another. The retaining bolts 24 engage in and lock substantially semicircular transverse grooves 25 of the same cross-section located in corresponding opposite edges of the guide plates 15 to 17. This arrangement makes for easy assembly and disassembly of the guide plates 15 to 17, with reliable positioning, since these do not have to be inserted parallel but can be pivoted in or out around one of the edges indicated by 26. Between the frame 18 and the periphery of the guide plates 15 to 17 or their edges 26 is a gap that enables the guide plates to be gripped, possibly with a tool. An advantageous way of forming the transverse grooves 25 is to make these initially as holes, e.g. by punching or drilling, in precisely fixed positions in guide plates 15 to 17 of larger dimensions, and then cutting away the respective edges, e.g. by milling, until semi-circular transverse grooves 25 result.

Figure 4:
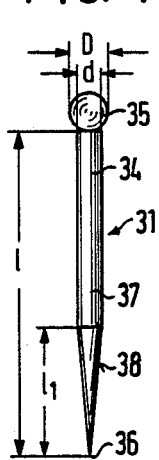
FIGS. 4 to 6 show various designs of test pins.
Figure 5:
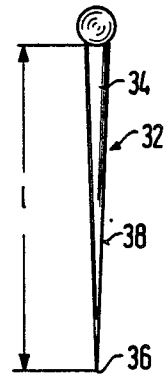
Figure 6:
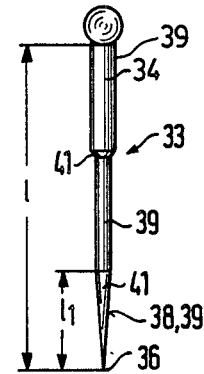

Each of the test pins shown in FIGS. 4 to 6 as 31, 32, and 33 consists of a shaft 34 of circular cross-section that has a spherical head at one end and is pointed at the other end. The tip is indicated in each case by 36.

The shaft 34 of the test pin 31 according to FIG. 4 at first runs cylindrically from the head 35 (shaft section 37) and is then tapered conically to its tip 36. The taper is indicated by 38 and extends over part ($l_1$) of the length l of the shaft; the length $l_1$ follows from the consideration that the generated surface of the taper must lie within a cylindrical envelope perpendicular to the guide plates.

The test pin 32 according to FIG. 5 is tapered conically down to the tip 36 over the whole length l of its shaft.

The test pin 33 according to FIG. 6 is tapered stepwise to the tip 36, the steps indicated by 39 being cylindrical. The transitions 41 from step to step are conically bevelled. The bottom step 39 in FIG. 6 is followed by a conical tip 41, the length $l_1$ of which is similarly determined and which can be regarded, and can function, as a further step.

To strengthen the tip 36 it is advantageous to form it by a slight blunting 30, which can be done by progressive tapering, rounding off, slight flattening or even by forming a conical point having a larger conical angle $w_1$ then the angle w of the main taper, indicated generally by 42. A tip 36 formed in this way is shown, by way of example, on a larger scale in FIG. 7.

In the embodiment shown in FIG. 6 the number of the steps 39 can depend on the number of guide plates used, i.e. at least in the upper part of the adapter 13 a step can be associated with each guide plate.

In the present embodiments the greatest diameter d of the shaft is 1.3 to 1.4 mm, while the diameter D of the head 35 is about 2 mm.

Figure 8:
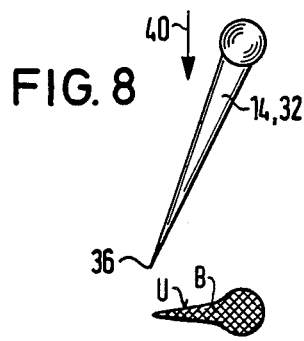
FIG. 8 shows a test pin and its projection image.

FIG. 8 shows a side view of a test pin 32 in the most inclined position together with its projection image B in the projection from above, i.e. at right angles to the guide plates and along the arrow 40. This shows clearly that in the projection image B the tip is on its perimeter U.

Figures 9, 10:
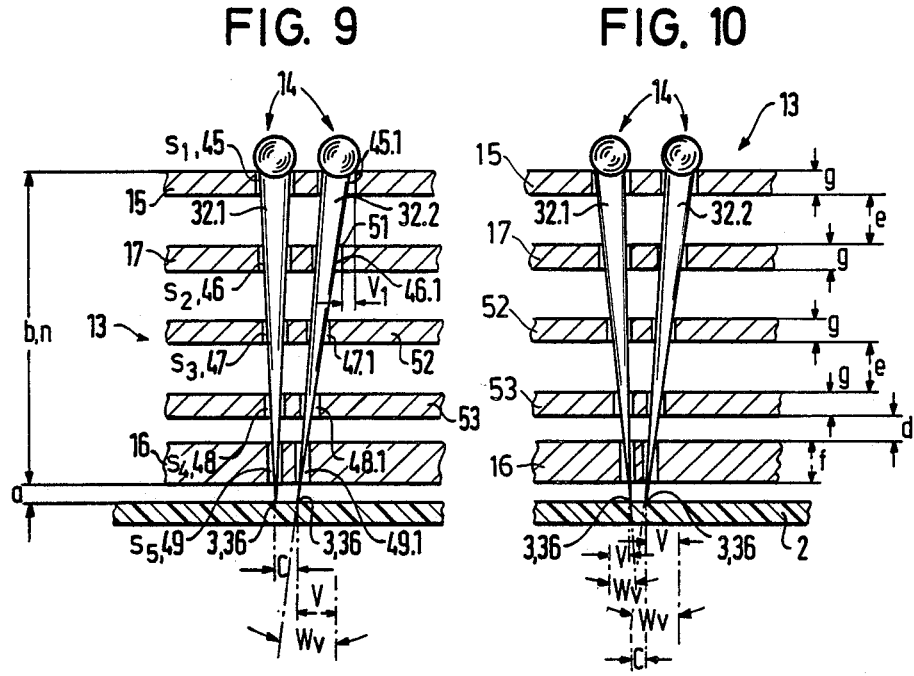
FIGS. 9 and 10 show various positions and inclinations for test pins in the adapter.

The arrangements of test pins in FIGS. 9 and 10 represent two test pin positions which in principle have maximum inclination, in which as shown in FIG. 1 they connect the test contact heads 8 with the test points 3 of the printed circuit board 2. In the example according to FIG. 9, in which test pins 32 according to FIG. 5 are used, the test pin 32.1 and the cylindrical guide holes 45 to 49 that receive it are centered on a common axis positioned at right angles to the guide plates, i.e. there is no lateral displacement between the guide holes 45 to 49; or in other words the guide holes 45 to 49 are on the grid. In contrast to this the test pin 32.2 is in a position of maximum inclination in which its tip 36 is displaced relative to the respective head 35 and guide hole 45.1 by the displacement V towards the test pin 32.1. The guide holes 46.1 to 49.1 are thus off the grid. The wall thickness between the guide holes 49 and 49.1 is determined on the one hand according to the strength requirements and on the other hand according to the angle of displacement $w_v$ and the distance of the point 36 from the lowest guide plate 16, which amounts to about 0.6 mm and represents the contact section a of the shaft 34 of the test pin. The remaining section b of the shaft 34 of the test pin is the guidance section, on which the test pin is radially positioned. The guidance section b corresponds to the height n of the adapter 13. The arrangement according to the invention enables distances C between the points 36 to be achieved that amount to about 0.6 mm. Such small distances C are particularly desirable for SMD (surface mounted device) test pieces.

The displacement $v_1$ between the guide hole 45.1 in the guide plate 15 and the guide hole 46.1 in the guide plate 16 is such that, on introducing the test pin 32.2 vertically, its tip meets the guide hole 46.1 at a position slightly inside its rim 51 so that the test pin 32.2 necessarily enters the guide hole 46.1 and is thus inclined. The guide holes 47.1 and 48.1 in the two additional guide plates 52, 53 present between the guide plate 16 and the bottom guide plate 16 can be correspondingly displaced so that when there is a slightly blunted tip 36 (see FIG. 7) or a taper 38 according to FIG. 4 a corresponding effect is produced on insertion into the respective guide hole. In the case of the embodiment according to FIG. 5 it should however basically be explained that the first two guide plates 15 and 17 can ensure reliable guidance into the bottom guide hole 49, 49.1, since the sides of the shaft 34 are straight. In this case the respective guide holes 45 to 49, 45.1 to 49.1 belonging to the guide plates 15, 17, 52, 53 preferably have the same diameter. However the diameter of the guide holes in the guide plates 15, 17, 52, 53 should be adapted to the tapering diameter of the test pin from guide plate to guide plate, apart from the cylindrical region 37 of the test pin 31. The diameters of the guide holes 45 to 49 and 45.1 to 49.1 thus decrease towards the tip 36 of the test pin 14.

The clearance $S_1$ to $S_5$ in the guide holes decreases in the direction of insertion 54 (FIG. 2) of the test pin 32. For more accurate guidance a clearance $S_5$ of only 0.1 to 0.2 mm is provided for the lowest guide hole 49, 49.1.

The arrangement described above makes for reproducible positioning of the test pins in the positions in the guide plates predetermined by the guide holes.

The function of the guide plates 52, 53 is essentially to provide lateral support, since in this region the guide pins 14 and 31, 33 are very thin, and therefore flexible, because of the tapered crosssection 38. The supporting function is particularly effective if in use the test pin 14 is placed under axial pressure so as to contact the test points 3 and the test contact heads 8. For the same purpose the distance d (FIG. 10) between the bottom guide plate 16 and the guide plate 53 above it is smaller than the distance e between the other guide plates, these other distances e preferably being equal.

In the embodiment according to FIG. 10 test pins 32 are likewise used, the displacement V or displacement angle $w_y$ being smaller than in the embodiment previously described, since the tips 36 of the two test pins 32.1, 32.2 are displaced or inclined towards one another by the same displacement V.

From FIGS. 9 and 10 it can be clearly seen that because of the tapering of the test pin 14 according to the invention the distance C between the tips of two adjacent test pins 14, at least one of which is inclined, can be substantially reduced. In the present embodiment the smallest distance C amounts to 0.6 mm. That is to say, even test pieces (circuit boards) with a small distance between test points 3 can be tested.

Figures 11, 12:
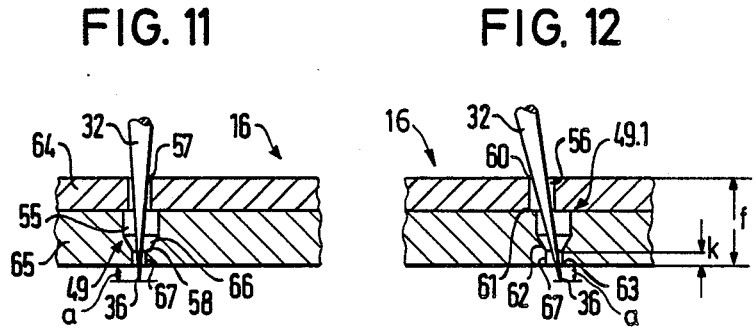
FIGS. 11 to 14 show details of the guidance of the test pins on a larger scale.

Further features making for improved lateral support of the test pins 14 and 31 to 33 can be seen from FIGS. 11 and 12. One feature consists in making the lowest guide plate 16 thicker (f) than the thickness g (FIG. 10) of the other guide plates 15, 17, 52, 53, which can have the same thickness as one another. The greater the thickness f, the greater are the supporting sections, which can be particularly effectively used when the guide holes 49, 49.1 are conically shaped (not shown) to match the taper 38 of the test pin 14, or are arranged in steps. These steps can be formed on the one hand by a widening 55 (FIG. 11), approximately in the middle of the hole, in the guide hole 49, 49.1 and/or by at least one displaced section 56 (FIG. 12) of the hole, whereby, with corresponding adaptation of the respective hole diameter to the diameter of the taper 38, laterally supportive hole edges 57, 58 (FIG. 11) and 60 to 63 (FIG. 12) result. It is advantageous, in order more easily to realise the widening 55 of the hole and the displaced hole section 56, to form the bottom guide plate 16 in two parts 64, 65. It is also recommended to make the distance k of the hole widening 55 from the bottom of the bottom guide plate 16 small, preferably about 1 mm, so that when the test pin 14 is substantially vertical a point of support (hole rim 58) is obtained that is as near as possible to the tip 36 (FIG. 11). The transition from the bottoms of the hole widenings 55 to smaller hole sections 67 takes place through conical sections 66.

When the test pin 14 is inclined (FIG. 12) the tip 36 is already supported on the hole rim 63 at the bottom of the lowest guide plate 16, which is about 3 mm thick in the embodiments according to FIGS. 11 and 12. The distance a of the tip 36 from the lowest guide plate 16 amounts to about 0.8 mm.

Figure 7:
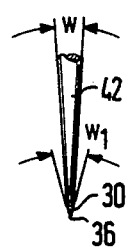
FIG. 7 shows an enlarged view of the tip of a test pin.

Insofar as the test pin 14 exhibits a progressive taper 30 according to FIG. 7 it is preferable for the length of the progressive taper 30 to be the same as or smaller than the distance k in FIG. 12 so as to ensure good guidance of the test pin 14 on raising the circuit board 2 into position for testing.

Figure 13:
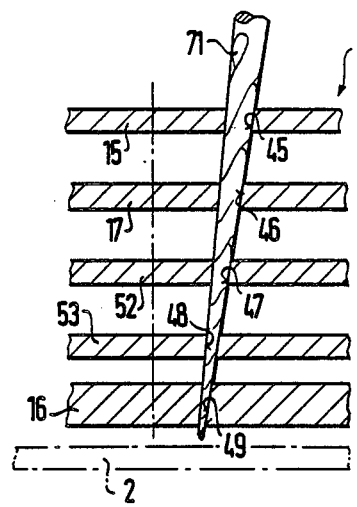
Figure 14:
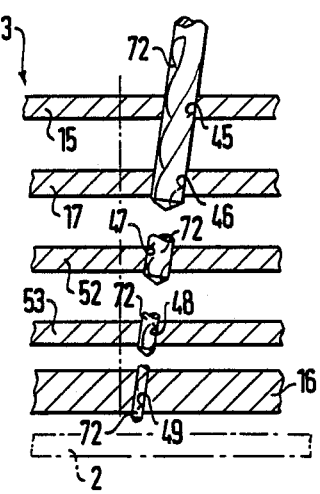

Within the scope of the invention it is also possible to provide, instead of cylindrical guide holes, guide holes that are adapted to the shape of the test pins at the respective position, in particular conical and/or stepped guide holes (cf. FIGS. 13 and 14). In the embodiment described above the guide holes 45 to 49 or 45.1 to 49.1 and 55, 56, 57 of circular section extend at right angles to the guide plates, which require the guide holes to be drilled separately. The individual positions of the guide holes can be precisely calculated and the guide holes can be drilled or stamped in a computer-controlled drilling or stamping machine. In the embodiments shown in FIGS. 13 and 14 the guide holes likewise shown there as 45 to 49 can be drilled in the desired inclined position of the test pin 14, 32 by means of several drills of corresponding thickness or conicity, or together by means of a conical and/or stepped or one-piece drill 71, 72 of suitable length. The drills 71, 72 have, with a certain degree of tolerance, forms and dimensions that correspond to the desired form and dimensions of the associated test pin or section of the test pin, cf. e.g. FIGS. 4 to 6, i.e. the guide holes can be conical and/or stepwise cylindrical in the desired inclined position, so that they extend coaxially to the test pin.

What is claimed is:

1. An adapter for a printed circuit board testing device, by means of which test contacts located on a grid can be connected to test points of a printed circuit board to be tested that are located on and/or off grid, said adapter comprising a test pin guide structure formed with guide holes arranged on the grid on one side of said structure and at least partially out of said grid on the other side of the structure, test pins received in said guide holes in the adapter, at least one of said pins being formed with a pointed contact section that projects from the adapter toward a respective contact point of the printed circuit board, said one pin test pin having an adjacent guidance section that is guided in an associated guide hole of the test pin guide structure, the cross-section of the guidance section of said one pin being greater than that of its respective pointed contacting section and being reduced along its length towards the contacting section, and the cross-section of the associated guide hole in said test pin guide structure being correspondingly reduced to permit said test pins to extend through the guide structure at converging inclinations so that respective contact points of adjacent test pins contact closely positioned test points on said printed circuit board.

2. An adapter according to claim 1, wherein the cross-section of at least one test pin is reduced over substantially its whole length.

3. An adapter according to claim 1 wherein the cross-section of the guidance section is reduced in steps and the transition from step to step towards the contacting section is conically tapered.

4. An adapter according to claim 1 wherein the test pin guide structure has a first and a second guide plate, and a third guide plate lying therebetween, said guide plates being arranged parallel to one another and having the guide holes for the test pins therein, the guide holes in the first guide plate being on the grid and the guide holes in the second guide plate being at least in part off grid.

5. An adapter according to claim 4, wherein the third and any further guide plates arranged between the third and the second guide plates likewise have guide holes that are at least in part off grid, the guide holes of the third and any further guide plates that are off-grid being so placed that on initial insertion vertically into the guide holes of the first guide plate the tapering ends of the test pins in each case still come within the test guide hole and are thus necessarily steered into the off-grid guide holes of the second guide plate as they are inserted further.

6. An adapter according to claim 4, wherein the cross-section of the pin guidance section is reduced progressively in step, the number of steps being equal to or one less than the number of guide plates.

7. An adapter according to claim 1, wherein the cross-section of at least one test pin tapers progressively, at least near its pointed contact section.

8. An adapter according to claim 4, wherein at least two further guide plates are arranged between the first and the second guide plate.

9. An adapter according to claim 8, wherein the distance between the second guide plate and its neighbouring guide plate is less than the distance between the outer guide plates.

10. An adapter according to claim 1, wherein the clearance between the test pins and their respective guide holes decreases in the direction of pin insertion into the guide holes.

11. An adapter according to claim 4, wherein the clearance between a test pin and a guide hole through which it extends in the second guide plate amounts to about 0.1 to 0.2 mm.

12. An adapter according to claim 4, wherein the pointed contact end of at least one test pin projects about 0.3 to 1.5 mm from the second guide plate.

13. An adapter according to claim 4, wherein the second guide plate is thicker than the other guide plates.

14. An adapter according to claim 4, wherein the diameter of the test pin in the region of the second guide plate amounts to about 0.4 mm.

15. An adapter according to claim 4, wherein the guide holes, at least in the second guide plate, converge in the direction away from said first plate.

16. An adapter according to claim 4, wherein the second guide plate is made up of an outer and an inner plate part, the inner part being closer to the first plate than the outer part.

17. An adapter according to claim 16, wherein a guide hole in the inner part of the plate is not displaced as far out of grid as the guide hole in the outer part of the plate.

18. An adapter according to claim 4, wherein the rims of the holes in the plates are dimensioned to establish clearance for the pins passing through the holes.

19. An adapter according to claim 4, wherein the guide plates are spaced apart by spacer rails that form a frame.

20. An adapter according to claim 19, wherein the guide plates are positioned in at least two transverse grooves formed in opposite sides of the frame and wherein retaining bolts located in said frame are arranged to hold said plates.

21. An adapter according to claim 1, wherein the cross-section of a first portion of the guidance section of said one test pin that is adjacent said contacting section is reduced toward said contacting section, and the cross-section of the portion of the guidance section that is adjacent said first portion is of substantially constant cross-section.

22. An adapter according to claim 4, wherein said guide holes extend at right angles relative to said first, second and third guide plates.

23. An adapter according to claim 4, wherein the guide holes extend in an oblique direction corresponding to the degree to which the guide holes in the second guide plate are arranged off grid.

24. An adapter according to claim 1, wherein said one test pin includes a spherical head at an end opposite said contact section.

25. An adapter according to claim 24, wherein said one test pin is adapted to be inserted into said associated guide hole from said one side of said test pin guide structure.

26. A test pin according to claim 1, wherein the cross-section of the guidance section is reduced in steps.

* * * * *